METHOD OF MANUFACTURING THERMOELECTRIC DEVICES

Filed Nov. 7, 1968

3 Sheets-Sheet 1

Inventor
Allen T. Puder
By James J. Jennings Jr.
Attorney

METHOD OF MANUFACTURING THERMOELECTRIC DEVICES

Filed Nov. 7, 1968 3 Sheets-Sheet 2

Inventor
Allen T. Puder

By James J. Jennings, Jr.
Attorney

Inventor
Allen T. Puder
By James J. Jennings, Jr.
Attorney

United States Patent Office 3,561,109

Patented Feb. 9, 1971

3,561,109
METHOD OF MANUFACTURING THERMOELECTRIC DEVICES

Allen T. Puder, Pasadena, Calif., assignor to Borg-Warner Corporation, Chicago, Ill., a corporation of Delaware Filed Nov. 7, 1968, Ser. No. 774,156
Int. Cl. B01j *17/00;* H01l *15/00*
U.S. Cl. 29—573 4 Claims

ABSTRACT OF THE DISCLOSURE

A method of forming a thermoelectric module includes shaping two pairs of electrically conductive plates, and placing a p-type layer of thermoelectric material between the first pair of plates and an n-type material between the second pair of plates. Each plate has openings placed so that cuts along predetermined lines result in separation of the plates from the sandwich, with each separated plate individually carrying conjugate mating segments of thermoelectric material. Appropriate sizing of the p-type and n-type layers of thermoelectric material affords ready control of the individual thermoelectric element cross-sectional area and the element length, to provide optimum performance of a multi-stage thermoelectric assembly. The separated plates are interfitted into a composite sandwich of p- and n-type materials to form a thermoelectric module.

BACKGROUND OF THE INVENTION

Many problems are encountered in constructing thermoelectric modules. Because of the intricate use of semiconductor materials formed into particular shapes and connected into operative circuits, the construction of modules often requires careful hand work. The thermoelectric circuit requires that adjacent elements of thermoelectric material be of alternate p (positive) and n (negative) materials, and coupled in an electrical circuit. As a result, the cost of modules is relatively high and their use is restricted.

Accordingly, it is a main consideration of the present invention to provide an improved method for constructing a thermoelectric module following a novel procedure facilitating the assembly of the modules, in which the relatively small and numerous semiconductor segments or elements are maintained oriented so as to be easily assembled into a required pattern of alternate p and n type segments, coupled in an electrical circuit.

Another primary consideration of this invention is the control of the cross-sectional area of each individual thermoelectric element is a simple manner, with a facile determination of the number of p and n-type segments in each stage when a multi-stage assembly is fabricated, to achieve optimum performance of the assembly.

Another important consideration of the present invention is to provide a method for constructing or assembling thermoelectric modules which reduces the handling of individual thermoelectric segments or elements in a thermoelectric module.

It is an ancillary aspect of the present invention to provide a method for constructing thermoelectric modules which reduces the cost of the modules and permits economical manufacture of module configurations heretofore considered difficult or unusual.

SUMMARY OF THE INVENTION

A preferred method of manufacturing a thermoelectric module according to this invention comprises the following steps. Two pairs of plates, each of which is formed of electrically conductive material, are shaped so that a reference opening is located at the same reference location in each plate. A plurality of additional openings are then provided in each plate, which additional openings are symmetrically positioned in a regular pattern to define a series of solid material areas alternating with the open areas of the additional openings. In a preferred embodiment the reference opening is a generally circular aperture centrally positioned in each plate, and likewise the additional openings are substantially circular and are positioned outwardly of the central reference opening. It will become apparent that other shapes and physical locations of these openings can be utilized in practicing the method of this invention.

A body of p-type material is provided, and includes an index opening corresponding generally in location and in size with the reference opening in the two pairs of plates. One pair of these plates is then used in forming a first sandwich, by placing a first plate of this pair on one side of, and in physical contact with, the body of p-type material. The second plate of this pair is placed on the opposite side of, and in physical contact with, the body of p-type material. This first sandwich-type assembly is indexed by aligning the index opening in the p-type material with the reference openings in the pair of plates engaging the p-type material. The additional openings of the upper plate of the sandwich are located generally over the solid material areas in the lower plate, while the solid areas of the upper plate are located over the open areas defined by the additional openings in the lower plate. With this alignment the outer portions of each additional opening in the upper plate overlaps outer portions of at least two of the additional openings in the lower plate. Line cuts are then made between the reference opening and the points at which each of the additional openings in the upper plate overlaps one of the additional openings of the lower plate, thus separating the continuous p-type material into a series of thermoelectric elements or segments adhering to an adjacent one of the plates in a conjugate pattern for mating with a similar conjugate pattern.

In exactly the same manner a body of n-type material is provided, and includes an index opening corresponding generally in location and size with the reference opening in the second pair of plates. A second sandwich is formed using the other pair of plates and the body of n-type material, following the alignment procedure and making the line cuts as detailed in the preceding paragraph. This provides a pair of half-sandwiches including n-type thermoelectric elements in a conjugate pattern exactly similar to that provided with the p-type element. Then each half-sandwich with p-type elements is mated with a corresponding half-sandwich carrying n-type elements so that the conjugate mating thermoelectric elements interfit in a unitary module assembly, in which adjacent elements are of opposite conductivity type. Suitable electrical connections are made to intercouple the adjacent thermoelectric elements, except for two elements which are connected to receive energy from the external supply circuit.

In practicing the preferred method of manufacture according to this invention, the regulation of the cross-sectional area of each individual p- and n-type segment is readily attained, and the number of segments provided in each stage of a multi-stage assembly can be readily modified. This simple control of the dimensions of each segment, together with simple interchange of the number of segments in a given stage, greatly enhances the construction of a cascade (or multi-stage) thermoelectric assembly with either maximum efficiency or maximum temperature differential between the cold junction and the heat sink. These dimensional requirements and their significance are detailed, for example, at column 4, lines 20–75, in Pat. No. 3,125,860, which issued Mar 24, 1964 to the assignee of this application.

THE DRAWING

In the several figures of the drawing like reference numerals identify like elements, and in the drawing.

Figure 3A:
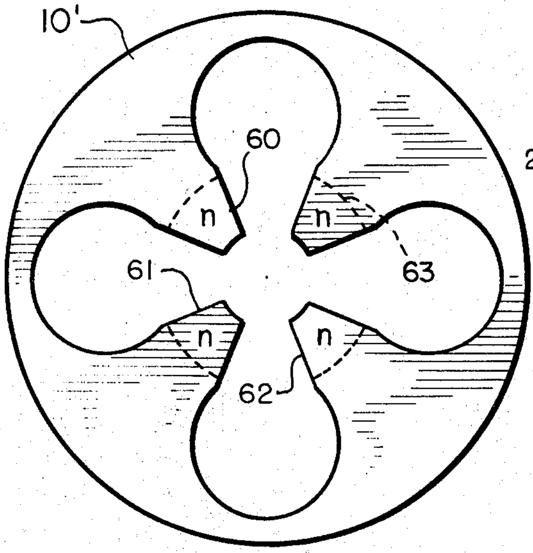
Figure 3B:
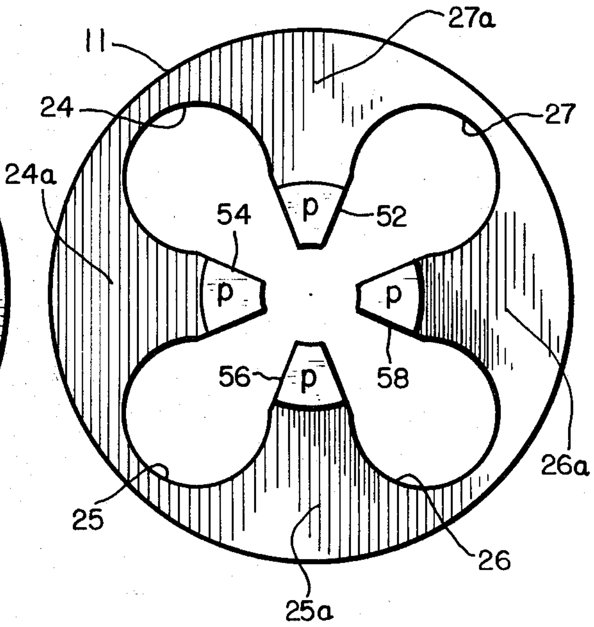
Figure 4:
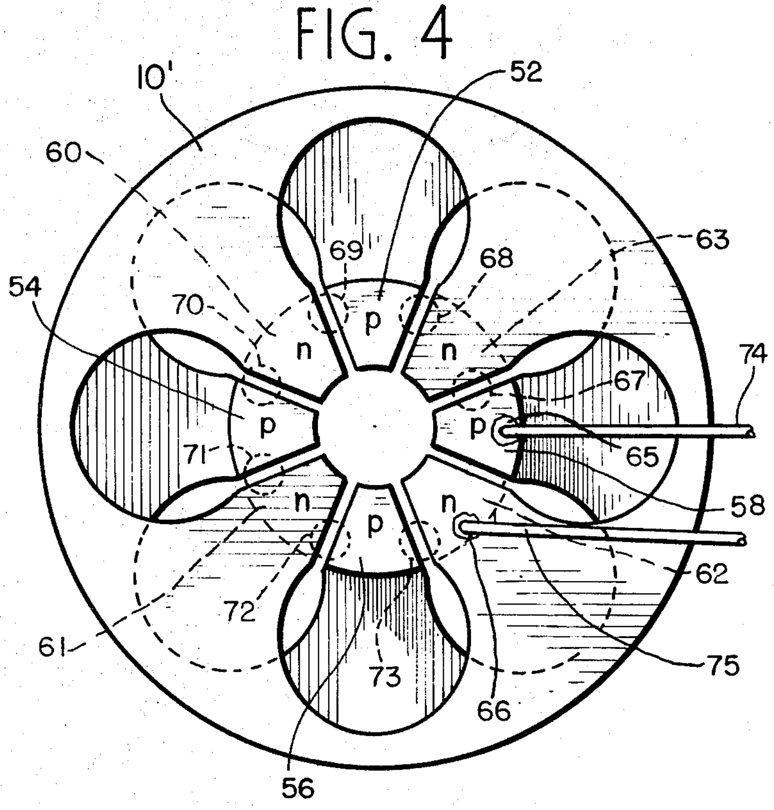
Figure 5:
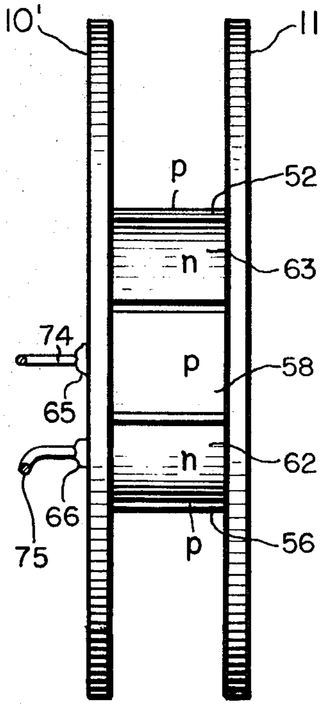
Figure 6:
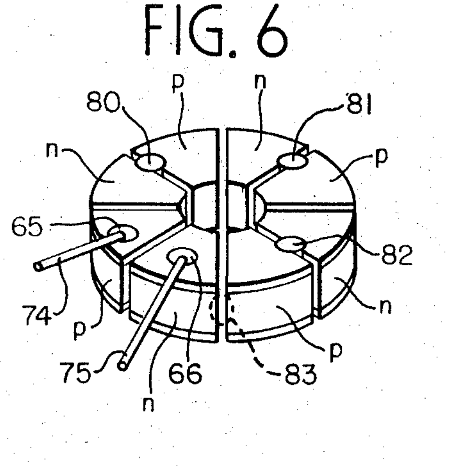
Figure 7:
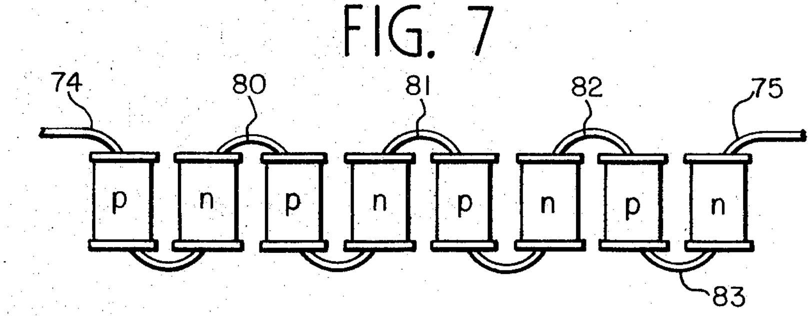

FIGS. 3*a* and 3*b* are plan views of two half-sandwiches, each carrying thermoelectric elements of different conductivity types;

FIG. 4 is a plan view, FIG. 5 is a side view, and FIG. 6 is a perspective view, of a composite thermoelectric module formed by mating the half-sandwiches illustrated in FIGS. 3*a* and 3*b*;

FIG. 7 is a schematic illustration of a single-stage thermoelectric module; and

Figure 8:
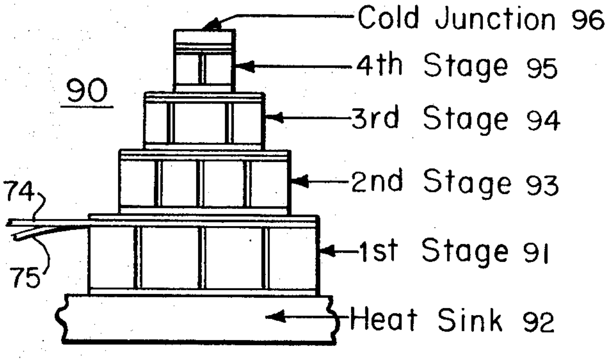
Figure 9:
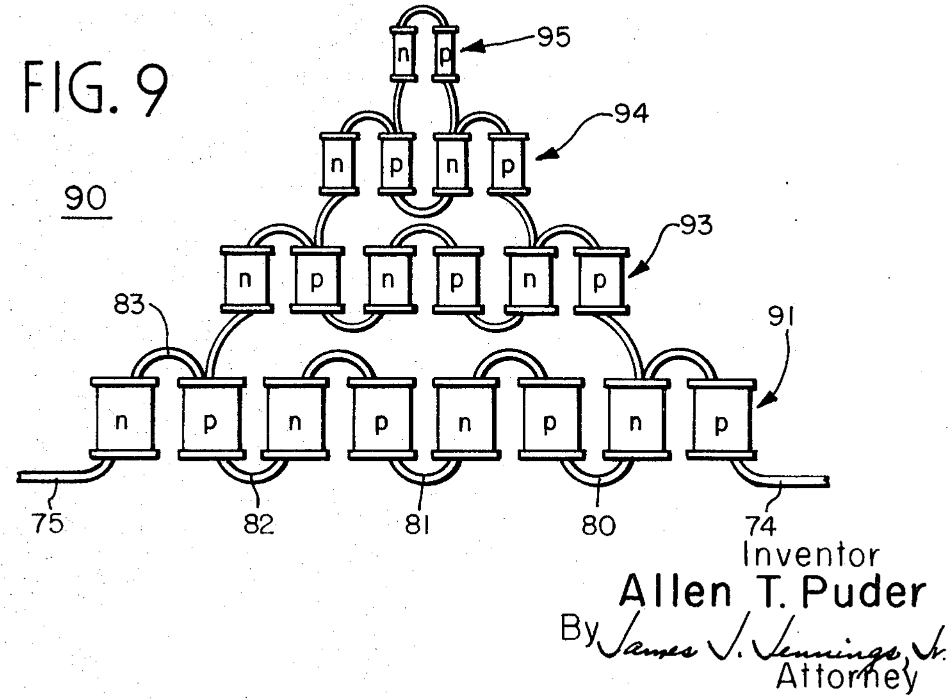

FIG. 8 is a side view, and FIG. 9 is a schematic drawing, of a four-stage cascade thermoelectric assembly.

DETAILED DESCRIPTION OF THE INVENTION

Figures 1, 2:
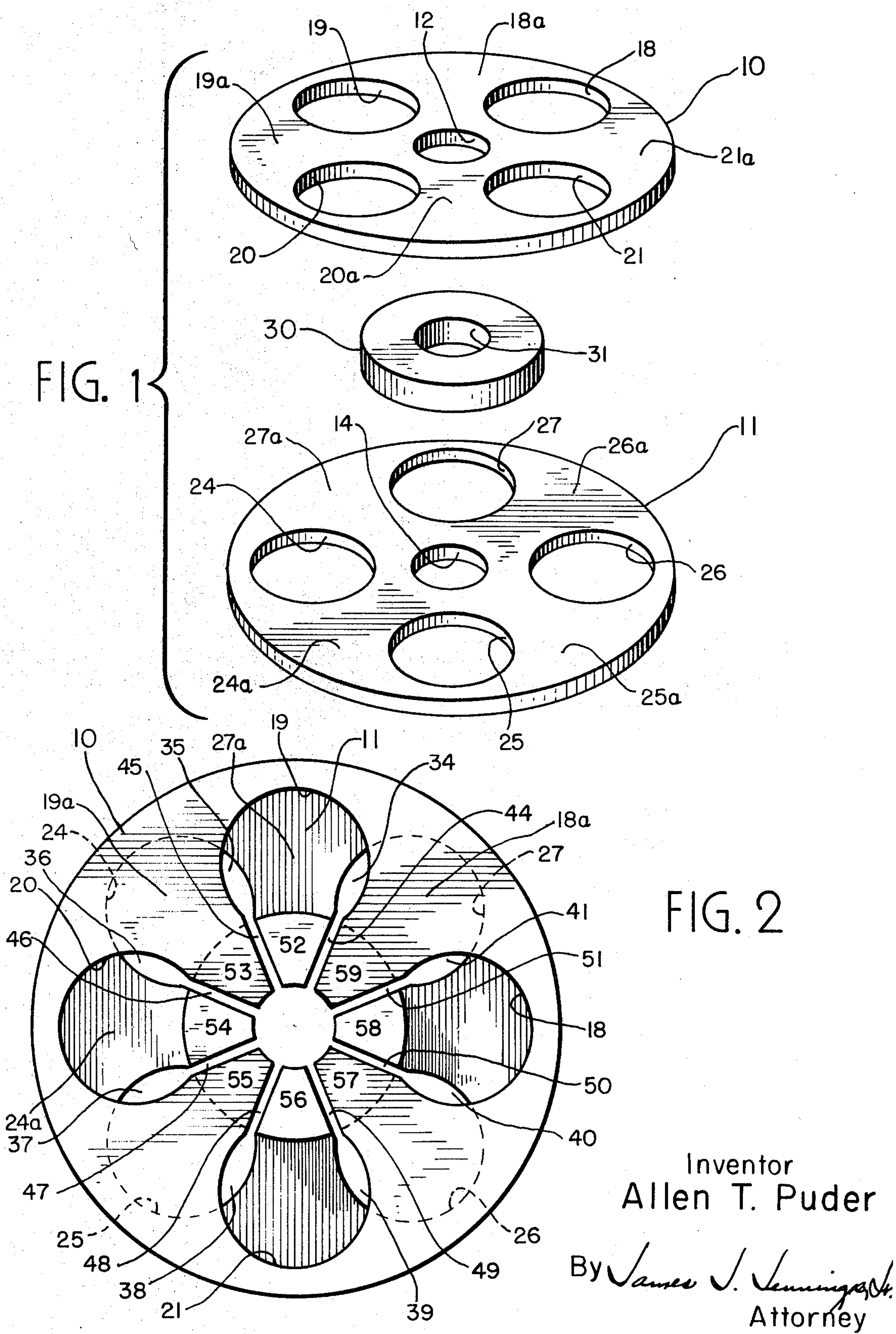
FIG. 1 is an exploded view of one pair of the electrically conductive plates and a body of thermoelectric material.
FIG. 2 is a plan view of a sandwich formed by assembling the components show in FIG. 1, and showing the spaced apart line cuts.

In a preferred method a thermoelectric module is constructed with a generally circular configuration. FIG. 1 depicts a pair of electrically conductive plates 10 and 11, each having a central alignment opening. Such opening is referenced 12 in plate 10 and 14 in plate 11. The plates, 10, 11 may be of copper or another electrically conductive material. Symmetrically positioned in a regular pattern outwardly of, and disposed about the central alignment opening, are a plurality of additional openings. These additional openings are referenced 18, 19, 20 and 21 in plate 10, and 24, 25, 26 and 27 in plate 11. The openings are cut in a particular manner, that is, to define a series of areas of solid material alternating with the additional openings. In plate 10, areas 18*a*, 19*a*, 20*a*, and 21*a* alternate with openings 18–21, and in plate 11, areas 24*a*, 25*a*, 26*a* and 27*a* alternate with openings 24–27. The additional or outboard openings 18–21 and 24–27 are radially spaced from the respective central alignment openings 12, 14, so as to provide an electrical coupling surface permitting connection of the respective plates 10 and 11 to a layer or plate of thermoelectric material 30.

The illustrated layer or body 30 is formed of p-type thermoelectric material with an index opening 31 generally corresponding in location and size with the central reference openings 12 and 14 in the respective plates 10 and 11. The thickness of body 30 is determined by the thermoelectric requirements of the module.

To form a first sandwich using plates 10, 11 and the p-type body 30, plates 10 and 11 are oriented or indexed with their reference openings 12, 14 aligned with index opening 31 in the body 30. Moreover the additional openings 18–21 of the first or upper plate 10 are generally located over the alternate areas of solid material 24*a*–27*a* in the second plate 11. Similarly solid areas 18*a*–21*a* of first plate 10 overlie circular openings 24–27 in second plate 11. This alignment is better shown in FIG. 2.

In forming the first sandwich, the plates 10 and 11 are affixed to, and at the same time connected electrically with, p-type body 30 of thermoelectric material by suitable means, for example, soldering. The dimensions and alignment of the respective additional openings 18–21 and 24–27 are selected such that an outer portion of each opening in one plate overlaps the outer portion of at least two openings in the other plate. These overlapping, or coincident-aperture locations, are identified numerals 34–41, inclusive, in FIG. 2. Numeral 34 references the coincidence of openings 19 and 27; 35 identifies the common opening of 19 and 24; and so forth to 41, marking the coincident portions of 18 and 27.

As a subsequent step of the inventive method, line cuts 44–51 are made in the first sandwich from the central open area (openings 12, 31 and 14) to the outer points or areas 34–41 where there is overlap between the outer openings in plate 10 and the outer openings in plate 11. This separates the erstwhile continuous body 30 into a succession of individual thermoelectric elements 52–59. Two half-sandwiches or conjugate mating arrays of elements and plates are thus formed. Elements 53, 55, 57 and 59 are still affixed to first plate 10. As shown in FIG. 3*b*, segments or elements 52, 54, 56 and 58 remain attached to second, or lower, plate 11.

A body of n-type material, not shown but otherwise similar to body 30, is then provided and used with another set of plates 10, 11 (not shown) to form a second sandwich, following the procedure detailed above. After the line cuts are made, two half-sandwiches are produced. One of these (the upper portion) is shown in FIG. 3*a*, with plate 10′ supporting n-type thermoelectric elements 60, 61, 62 and 63 on its underside in a conjugate mating pattern. As with the first sandwich, the overlap of the openings and the central opening in each plate, and the selected size and attachment or connection of the thermoelectric layer material, assure that after the line cuts, the respective plates can be separated into half-sandwiches and the segments of p- and n-type material are positioned in suitable orientation for subsequent interlocking.

In FIGS. 3*a* and 3*b*, the half-sandwiches including plates 10 and 11 are conjugate mating in that the segments 60–63 on plate 10′ interfit between the segments 52, 54, 56 and 58 on the other plate 11. The sizes of the outer openings are selected to impart a generally symmetrical shape and spacing to the respective thermoelectric segments when the line cutting of the sandwiches is completed. The saw kerf provides sufficient clearance so that the segments interfit easily. The thermoelectric material bodies, both the layer of p-type material and the layer of n-type material, are of predetermined, uniform thickness so that they are snugly sandwiched between the respective outside conductive material carriers or plates. As a result, a composite sandwich having alternate segments of p- and n-type thermoelectric material is formed by uniting the half-sandwiches shown in FIGS. 3*a* and 3*b* into the composite thermoelectric module assembly shown in FIG. 4.

To establish a complete electrical circuit connecting the thermoelectric segments of the composite sandwich, and thereby complete the construction of the thermoelectric module, as herein shown, a first terminal 65 is coupled to thermoelectric segment 58 and a second terminal 66 is coupled to an adjacent n-type thermoelectric segment 62. The remaining adjacent segments in between are electrically connected alternately at plate 10′ or 11, but thermoelectric segments 58, 62 are not electrically connected in this circuit. The electrical circuit is completed by connecting thermoelectric material segment 58 to thermoelectric segment 63 at plate 10′ by solder 67 or other material; segment 63 is electrically connected to segment 52 at plate 11 by connection 68; segment 52 is electrically connected to segment 60 at plate 10′ by connection 69; segment 60 is electrically connected to segment 54 at plate 11 by connection 70; segment 54 is electrically connected to segment 61 at plate 10′ by connection 71; segment 61 is electrically connected to segment 56 at plate 11 by connection 72; and segment 56 is electrically connected to segment 62 at plate 10′ by connection 73. The plates, in other words, serve both as a support or carrier for the thermoelectric segments during the assembly of a thermoelectric composite sandwich, and subsequently function as electrical conductors in the thermoelectric module circuit. A pair of energizing conductors 74, 75 are respectively coupled to terminals 65, 66 to supply unidirectional electrical energy to the module. One of plates 10′ and 11 will serve as the cold plate, and the other as the hot (or heat removal) plate, depending on the direction of current flow.

FIG. 6 depicts the assembly of FIG. 5 and shows the electrical connections for conductors 74 and 75. The other inter-segment connections 80, 81 and 82 are shown where they appear on the top of the assembly, and one of the lower surface electrical connections 83 is also indicated. The plates 10', 11 of FIG. 5 can be cut or machined down to substantially the same outer diameter as the p-type and n-type segments to provide the compact assembly depicted in FIG. 6. The electrical equivalent circuit of the assembly shown in FIG. 6 is set out in FIG. 7.

The simplification of assembly construction is evident from the procedure just described. In accordance with another important aspect of this invention, the described method can be followed as each successive stage of a multi-stage assembly is fabricated. With the simple control of the individual element cross-sectional area afforded by practice of this invention, and the appropriate selection of the number of segments employed in each stage, each successive stage can be simply fabricated to achieve the best operating characteristics in accordance with the criteria set out in Pat. No. 3,125,860.

FIG. 8 shows a cascade or multi-stage assembly 90 constructed by following the method of this invention. First stage 91 is assembled following the teaching set out above to provide a module such as that shown in FIG. 6. One side of the first stage is then affixed to heat sink 92, and the other side of the first stage is interfaced with the second stage 93, also constructed in accordance with the same teaching. A similar procedure is followed for the third stage 94 and the fourth stage 95, with the cold junction or cold plate 96 then being affixed to the top of stage 95. With energization of the assembled cascade over conductors 74 and 75, cold plate 96 is cooled and heat is removed from the hot plate 92 in a well known manner.

FIG. 9 illustrates the electrical circuit for the cascade assembly 90. The electrical connections there shown are those useful to achieve an optimum design of a four-stage cascade assembly. The cross-sectional area of each thermoelectric element regulates the electric current passing through such element and thus energization of each of the parallel circuits is controlled.

The use of individual elements which are cylindrical sections or segments affords simple fabrication of each stage. Control of the cross-sectional area of each segment is easily maintained by machining the outside diameter of each module, and drilling the inside diameter or indexing aperture of each stage to the dimensions determined by the design criteria. Further the inside diameter can be varied within a given stage to modify the cross-sectional area of several segments in that stage of a cascade assembly, to achieve the optimum operating characteristics.

It is clear from the foregoing that there is a minimum handling of thermoelectric material segments in following the method of this invention. As is well known in the art of thermoelectric module manufacturing, it is necessary to provide the alternate positioning of different conductivity types of thermoelectric materials in adjacent configurations, yet it is also necessary to connect the segments in one complete electrical circuit so that one circuit comprises many thermoelectric segments. Instead of requiring that each segment which may have a very small dimension be handled individually, the present manufacturing method permits production of a complete module with a large number of thermoelectric segments without the necessity of handling the segments as individual pieces.

The teaching of the invention given above is related to a circular module configuration. It is of course possible to use other configurations, wherein the respective additional openings in the sandwich have overlapping portions so that line cuts directed from a central opening will result in spaced apart positioning of one type of thermoelectric material supported on an outside plate or carrier for easy handling. Another conjugate mating sandwich can be prepared and the respective thermoelectric segment carriers joined together to form a module.

While only particular embodiments of the invention have been shown and described, it will be apparent to those skilled in the art that various changes and modifications may be made therein without departing from the invention in its broader aspects. Therefore the aim in the appended claims is to cover all such changes and modifications as may fall within the true spirit and scope of the invention.

What is claimed is:

1. The method of manufacturing a thermoelectric module, comprising the steps of:

shaping two pairs of plates of electrically conductive material to define a reference opening, located at the same reference location in each plate, and a plurality of additional openings in each plate, symmetrically positioned in a regular pattern, to define a series of solid material areas alternating with said additional openings;

providing a body of p-type material which defines an index opening corresponding generally in location and size with said reference opening in the two pairs of plates;

forming a first sandwich using one pair of said plates by placing a first plate of said one pair on one side of and contacting said body of p-type material and placing the second plate of said one pair on the opposite side of and contacting said body, indexing said first and second plates and said body such that said reference openings are aligned with said index opening and such that said additional openings in said first plate are generally located over said alternate areas of solid material in said second plate, and such that outer portions of each of said additional openings in said first plate overlap outer portions of at least two of said additional openings in said second plate, and affixing said body of p-type material to both said first and second plates;

making line cuts in said first sandwich between said reference opening and points at which each of said additional openings in said first plate overlaps one of said additional openings of the second plate in said one pair, thus separating the continuous p-type material into individual thermoelectric elements and forming two half-sandwiches each of which carries thermoelectric elements in a conjugate mating pattern;

providing a body of n-type material which defines an index opening corresponding generally in location and size with said reference opening in the two pairs of plates;

forming a second sandwich using the other pair of said plates and said body of n-type material, following the procedure detailed above to form said first sandwich;

making line cuts in said second sandwich between said reference opening and points at which each of said additional openings in one plate of the other pair overlaps one of said additional openings of the other plate of the same pair, thus separating the continuous n-type material into individual thermoelectric elements and forming two half-sandwiches each of which carries thermoelectric elements in a conjugate mating pattern;

mating one of said half sandwiches with p-type elements thereon with a half sandwich having n-type elements thereon so that the conjugate mating elements interfit with the elements of opposite conductivity type and such that adjacent elements are of opposite thermoelectric conductivity, and electrically intercoupling adjacent thermoelectric elements at selected points, except for two elements prepared to receive external circuit connections, to form a thermoelectric module.

2. The method of manufacturing a thermoelectric module, comprising the steps of:

shaping two pairs of circular plates of electrically conductive material to define a central circular opening, located at the same reference location in each plate, and a plurality of additional circular openings in each plate, symmetrically positioned in a regular pattern outwardly of the central opening, to define a series of solid material areas alternating with said additional circular openings;

providing an annular body of p-type material which defines a central index opening corresponding generally in location and size with said central circular opening in the two pairs of plates;

forming a first sandwich using one pair of said circular plates by placing a first plate of said one pair on one side of and contacting said annular body of p-type material and placing the second plate of said one pair on the opposite side of and contacting said body, indexing said first and second plates and said body such that said central circular openings are aligned with said central index opening and such that said additional circular openings in said first plate are generally located over said alternate areas of solid material in said second plate, and such that outer portions of each of said additional openings in said first plate overlap outer portions of at least two of said additional openings in said second plate, and affixing said body of p-type material to both said first and second plates;

making line cuts in said first sandwich between said central circular openings and points at which each of said additional circular openings in said first plate overlaps one of said additional circular openings of the second plate in said one pair, thus separating the continuous p-type material into individual thermoelectric elements and forming two half-sandwiches each of which carries thermoelectric elements in a conjugate mating pattern;

providing an annular body of n-type material which defines a central index opening corresponding generally in location and size with said central circular opening in the two pairs of plates;

forming a second sandwich using the other pair of said circular plates and said annular body of n-type material, following the procedure detailed above to form said first sandwich;

making line cuts in said second sandwich between said central circular openings and points at which each of said additional circular openings in one plate of the other pair overlaps one of said additional circular openings of the other plate of the same pair, thus separating the continuous n-type material into individual thermoelectric elements and forming two half-sandwiches each of which carries thermoelectric elements in a conjugate mating pattern;

mating one of said half sandwiches with p-type elements thereon with a half sandwich having n-type elements thereon so that the conjugate mating elements interfit with the elements of opposite conductivity type and such that adjacent elements are of opposite thermoelectric conductivity, and electrically intercoupling adjacent thermoelectric elements at selected points, except for two elements prepared to receive external circuit connections, to form a thermoelectric module.

3. The method of manufacturing a thermoelectric multi-stage assembly, comprising:

performing all the steps recited in claim 1 to produce a first thermoelectric module;

repeating all the steps recited in claim 1 to form a second thermoelectric module;

adjusting the inner index opening dimension and the outer peripheral dimension of at least some of the p-type and n-type elements in one of said first and second modules to provide dimensional control of those segments for optimum performance of the multi-stage assembly; and joining said first and second modules to provide a multistage thermoelectric assembly.

4. The method of manufacturing a cascade thermoelectric assembly, comprising:

performing all the steps set out in claim 2 to produce a first thermoelectric module;

repeating all the steps set out in claim 2 to produce a second thermoelectric module;

sizing the interior and exterior peripheral surfaces of at least certain of the p-type and n-type elements in at least one of the first and second modules to provide desired regulation of the individual thermoelectric element cross-sectional area with respect to individual thermoelectric element length, thus to provide optimum performance of the cascade thermoelectric assembly; and joining said first and second modules to provide a cascade thermoelectric assembly.

References Cited

UNITED STATES PATENTS

| | | | |
|---|---|---|---|
| 3,010,285 | 11/1961 | Penn | 62—3 |
| 3,125,860 | 3/1964 | Reich | 62—3 |
| 3,252,205 | 5/1966 | Hancock et al. | 29—573 |
| 3,269,872 | 8/1966 | Thompson | 29—573 |

JOHN F. CAMPBELL, Primary Examiner

W. TUPMAN, Assistant Examiner

U.S. Cl. X.R.

29—591; 62—3; 29—577